(12) United States Patent
Koszarsky

(10) Patent No.: US 6,271,731 B2
(45) Date of Patent: *Aug. 7, 2001

(54) CONTROL CIRCUIT FOR PROGRAMMABLE FREQUENCY SYNTHESIZER

(75) Inventor: Christopher R. Koszarsky, Holly Springs, NC (US)

(73) Assignee: Ericsson Inc., Research Triangle Park, NC (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/373,035

(22) Filed: Apr. 15, 1997

(51) Int. Cl.[7] .............. H03B 5/08; H03B 5/12; H03L 7/099; H03L 7/18

(52) U.S. Cl. .............. 331/36 C; 331/10; 331/16; 331/117 R; 331/177 V; 331/185; 455/260; 455/262

(58) Field of Search .............. 331/10, 16, 36 C, 331/116 R, 116 FE, 117 R, 117 FE, 117 D, 177 V, 185, 186; 455/260, 262

(56) References Cited

U.S. PATENT DOCUMENTS

| | | | |
|---|---|---|---|
| 3,723,906 | * | 3/1973 | Pedersen .............. 331/117 D |
| 4,322,692 | * | 3/1982 | Brewerton et al. .............. 331/2 |
| 4,484,157 | * | 11/1984 | Helle et al. .............. 311/116 R |
| 4,580,107 | * | 4/1986 | Caldwell et al. .............. 331/10 |
| 4,684,904 | * | 8/1987 | Watkins et al. .............. 331/117 R |
| 4,728,906 | * | 3/1988 | Turl et al. .............. 331/4 |
| 4,990,866 | * | 2/1991 | Martheli .............. 331/99 |
| 5,736,904 | * | 4/1998 | Humphreys et al. .............. 331/10 |

OTHER PUBLICATIONS

NUD7070 VHF Transceiver board Component Location Diagrams and Schematic Diagram.

* cited by examiner

Primary Examiner—David Mis
(74) Attorney, Agent, or Firm—Burns, Doane, Swecker & Mathis, L.L.P.

(57) ABSTRACT

A frequency synthesizer has a voltage controlled oscillator comprising a voltage controlled capacitor having a first terminal and a second terminal. A positive control voltage is applied to the first terminal of the voltage controlled capacitor and a negative control voltage is applied to the second terminal of the voltage controlled capacitor, causing the varactor to operate in a reverse biased state. A circuit for generating a negative control voltage is provided in a phase-locked loop circuit. The circuit includes a negative DC generator for generating a negative DC voltage from an AC signal, and a programmable variable attenuator for selectably attenuating the negative control voltage.

13 Claims, 4 Drawing Sheets

CONTROL CIRCUIT FOR PROGRAMMABLE FREQUENCY SYNTHESIZER

BACKGROUND OF THE INVENTION

1. Field of Invention

The present invention relates generally to control circuits for programmable frequency synthesizers. More specifically, the present invention relates to a control circuit for a programmable frequency synthesizer utilizing a voltage controlled oscillator circuit.

2. Description of Related Art

Voltage controlled oscillators are widely used in communication devices such as cellular telephones to generate oscillatory signals. In particular, a voltage controlled oscillator is one of the components of a phase-locked loop or PLL, which is an electronic circuit used to generate a stable oscillatory signal having a desired frequency of oscillation. Such circuits are commonly referred to as frequency synthesizers. The signal output by a PLL frequency synthesizer may be used, for example, as a carrier signal in a transmitter or as a local oscillator signal in a receiver.

In order to tune a transmitter or receiver to a particular frequency, it is necessary to alter the frequency of oscillation of the carrier or local oscillator signal in a controlled manner. This can be achieved by synthesizing the carrier and local oscillator signals using a programmable frequency synthesizer including a VCO. A VCO is tuned by varying an input DC control voltage level.

Most portable electronic devices use a five-cell or four-cell battery to generate DC power. Devices having five-cell and four-cell batteries can generate a regulated DC power supply voltage level of about 4.8 volts and 3.8 volts, respectively. In the case of a five-cell battery, the DC voltage control signal VC used as a control input to the VCO has a range of between about 0.7 and 4.3 volts, or approximately 3.6 volts. In the case of a four-cell battery, VC has a range of between about 0.6 and 3.0 volts, or 2.4 volts. The measure of the frequency responsiveness of a VCO with respect to input voltage VC is known as the gain of the VCO, and is measured in megahertz per volt (MHz/V). Thus, if the input control voltage has a lower range, the VCO must have a greater gain in order to be tunable over the same frequency range.

To be useful in an RF communication device such as a dual band cellular telephone, a voltage controlled oscillator must be tunable over a range of approximately 90 MHz for some applications. Thus, a VCO for use in a device having a five-cell supply must have a gain of about 26 MHz/Volt. A VCO for use in a device having a four-cell supply must have a gain of about 40 MHz/Volt.

One drawback to a VCO is the fact that it produces a certain amount of phase noise, which can degrade the performance of a communication system. A VCO must be designed such that phase noise is kept within certain predetermined limits. In a voltage controlled oscillator, phase noise is directly proportional to the gain of the oscillator. This is due to the fact that the varactor diode in a VCO exhibits a higher internal series resistance when a low control voltage is applied across its terminals. This resistance decreases the quality factor of the oscillator's resonant circuit, leading to increased phase noise.

There is currently a trend in the communication industry to design and produce electronic devices capable of operating with a three-cell battery. A three-cell battery provides a control voltage range of from about 0.5 to 2.2 volts, or 1.7 volts. A conventional VCO having a gain corresponding to such a control voltage range would exhibit unacceptable phase noise characteristics. Thus, there is a need for a voltage controlled oscillator and related control circuitry which exhibits acceptable phase noise performance in a device having a low supply voltage level relative to that normally used for the operation of a voltage controlled oscillator in a battery powered RF communications device, for example.

SUMMARY OF THE INVENTION

It is therefore an object of the present invention to provide a voltage controlled oscillator having improved phase noise performance when operated using a low supply voltage.

The foregoing objects are achieved in a voltage controlled oscillator including a voltage controlled capacitor having a first terminal and a second terminal. A positive control voltage is applied to the first terminal of the voltage controlled capacitor and a negative control voltage is applied to the second terminal of the voltage controlled capacitor.

In another aspect of the present invention, circuit for generating a negative control voltage is provided in a phase-locked loop circuit. The circuit includes a negative DC generator for generating a negative DC voltage from an-AC signal or a transitioning logic signal, and a programmable variable attenuator for selectably attenuating the negative control voltage.

These and other objects of the invention, together with features and advantages thereof will become apparent from the following detailed specification when read with the accompanying drawings in which like reference numerals refer to like elements.

DETAILED DESCRIPTION OF THE PREFERRED EMBODIMENTS

The present invention will now be described with reference to the accompanying drawings, in which a preferred embodiment of the invention is shown. However, this invention may be embodied in many different forms and should not be construed as limited to the specific embodiment shown.

Figure 1:
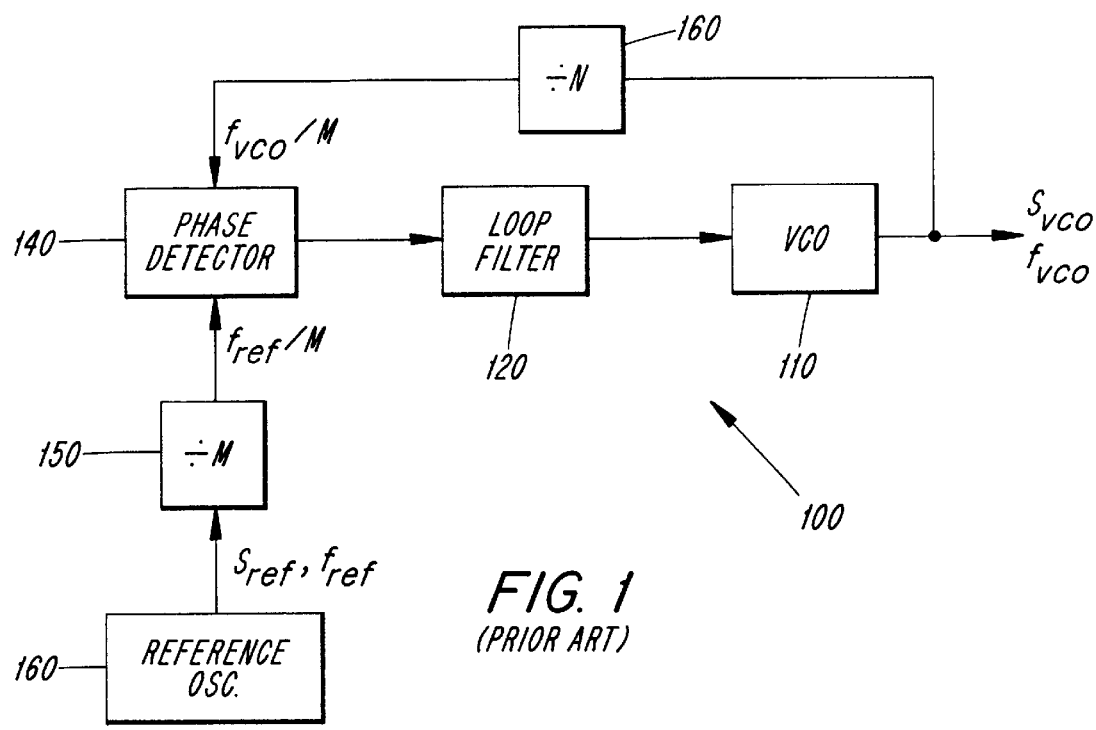
FIG. 1 is a block diagram of a conventional phase locked loop circuit.

A block diagram of a typical phase-locked loop incorporating a voltage controlled oscillator is shown in FIG. 1. A reference oscillator 170 generates a reference signal $S_{ref}$ at a predetermined frequency of oscillation. The frequency of the reference signal $S_{ref}$ is fixed at $f_{ref}$, and is dependent on the construction of the reference oscillator 170.

In a typical communications application, reference oscillator 170 is a temperature compensated crystal oscillator (TCXO) or oven-controlled crystal oscillator (OCXO) having a stable frequency of oscillation of 19.44 MHz; Such oscillators are highly stable, capable of maintaining a frequency of oscillation within a tolerance of approximately 3–5 parts per million.

The reference signal $S_{ref}$ is passed through a divide-by-M circuit 150 which divides the frequency of oscillation of $S_{ref}$ by a selected integer value (M). The divided signal is then provided to an input of a phase detector 140. Phase detector 140 generates a DC voltage signal that is proportional to the phase difference between two input oscillatory signals, one of which is the reference signal having a frequency of $f_{ref}/M$.

The output signal of phase detector 140, which is passed through loop filter 120 to remove residual AC elements, is used to control the frequency of voltage controlled oscillator 110. The output signal of VCO 110 (which is also the output signal of PLL 100) is passed through a divide-by-N circuit 160 and fed into a second input port of phase detector 140. Thus, phase detector 140 compares the phase of a signal of frequency $f_{ref}/M$ and the other of which is the output signal of the VCO having a divided frequency $f_{vco}/N$ with the phase of a signal of frequency $f_{vco}/N$. Depending on the values of the circuit elements included in the VCO 110, the PLL 100 output signal $S_{vco}$ will eventually settle on a stable frequency of oscillation that is equal to $f_{ref}(N/M)$.

A microprocessor may be used to change the values of M and N. In this manner, the frequency of oscillation of the output signal fvco may be digitally controlled.

Thus, it is apparent that a voltage controlled oscillator is a key element of a frequency synthesizer, since it permits a frequency of oscillation to be selected based on an applied input voltage.

Figure 2:
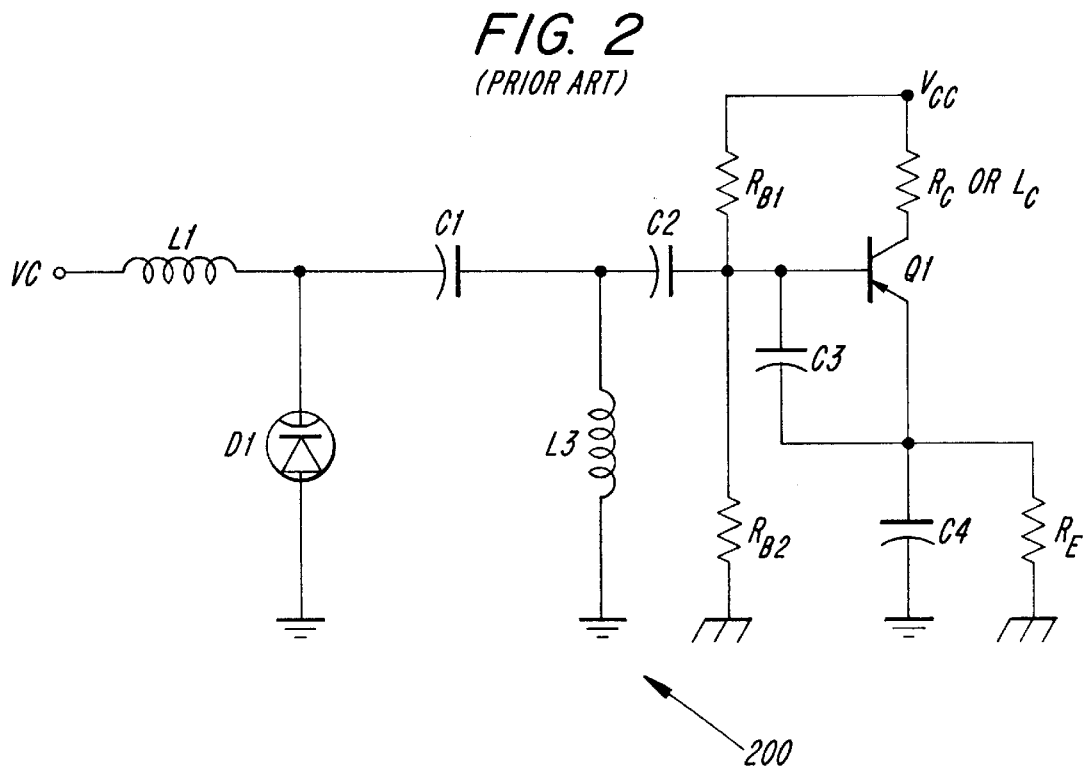
FIG. 2 is a schematic diagram of a conventional voltage controlled oscillator.

FIG. 2 illustrates a schematic diagram of a well known voltage controlled oscillator (VCO) circuit 200. VCO 200 includes a control voltage input VC applied to an inductor L1, which functions as an RF choke. Inductor L1 is operatively coupled to an LC network comprising varactor diode D1, inductor L3, and capacitors C1 and C2. C2 is also coupled to the base of transistor Q1. A capacitor C3 is coupled between the base and emitter of transistor Q1, and a capacitor C4 is coupled between the emitter of transistor Q1 and ground. Varactor diode D1, capacitor C1 and inductor L3 form a resonant circuit which determines the frequency of operation of VCO 200. The capacitance of varactor diode D1 is determined by the DC voltage applied across its terminals by VC. Thus, the frequency of oscillation of VCO 200 is determined by the input DC voltage level VC.

Figure 3:
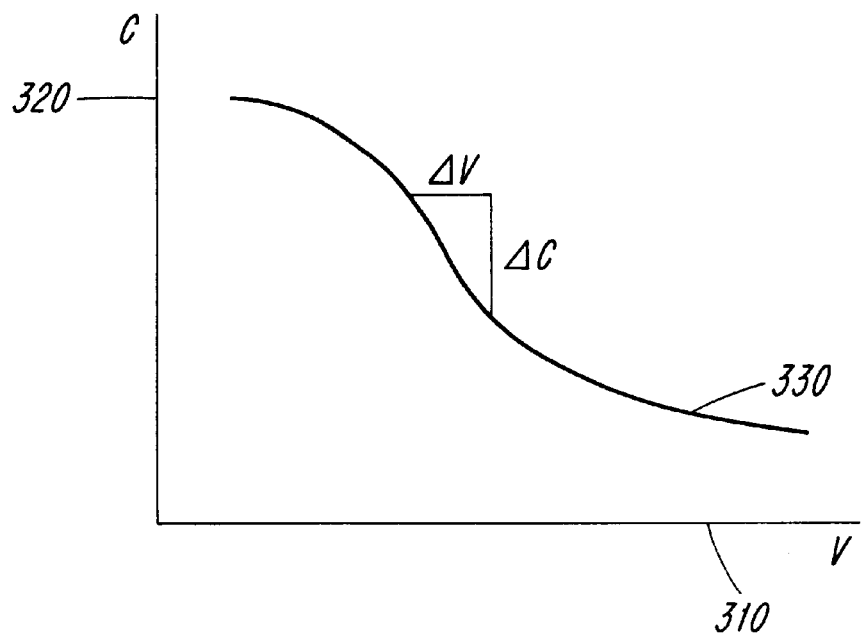
FIG. 3 is a graph showing a representative C-V characteristic of a varactor diode.

As illustrated in FIG. 3, the capacitance of varactor diode D1 is a function of the DC voltage applied across its terminals. As the voltage across diode D1 increases, its capacitance decreases. Since varactor diode D1 is an element of the resonant circuit which determines the frequency of oscillation of VCO 200, a change in the capacitance of varactor diode D1 (due to change in the level of control voltage VC) will result in a change in the frequency of oscillation of the VCO 200.

Figure 4:
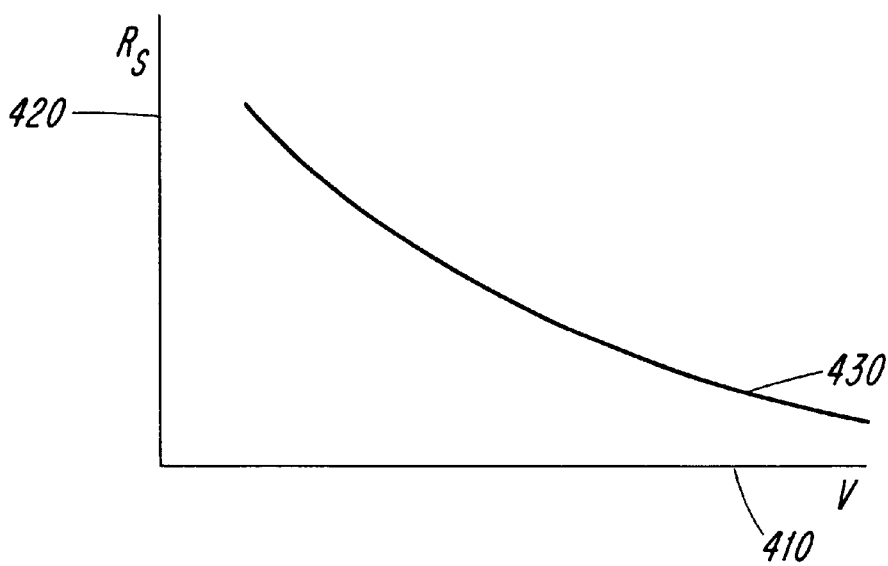
FIG. 4 is a graph showing the series resistance of a varactor diode versus the varactor bias voltage.

However, as illustrated in FIG. 4, as the voltage across varactor diode D1 decreases, the internal resistance of diode D1 increases. The internal resistance of diode D1 directly affects the resistance of the resonant circuit of VCO 200, lowering the quality factor of the resonant circuit and affecting the noise performance of VCO 200. Thus, when a low-range control voltage, for example a voltage range less than about 2.4. Volts is used to control VCO 200, VCO 200 will exhibit unsatisfactory noise characteristics. And, as noted above, in a three-cell device, there is a reduced DC voltage range available to control VCO 200.

Figure 5:
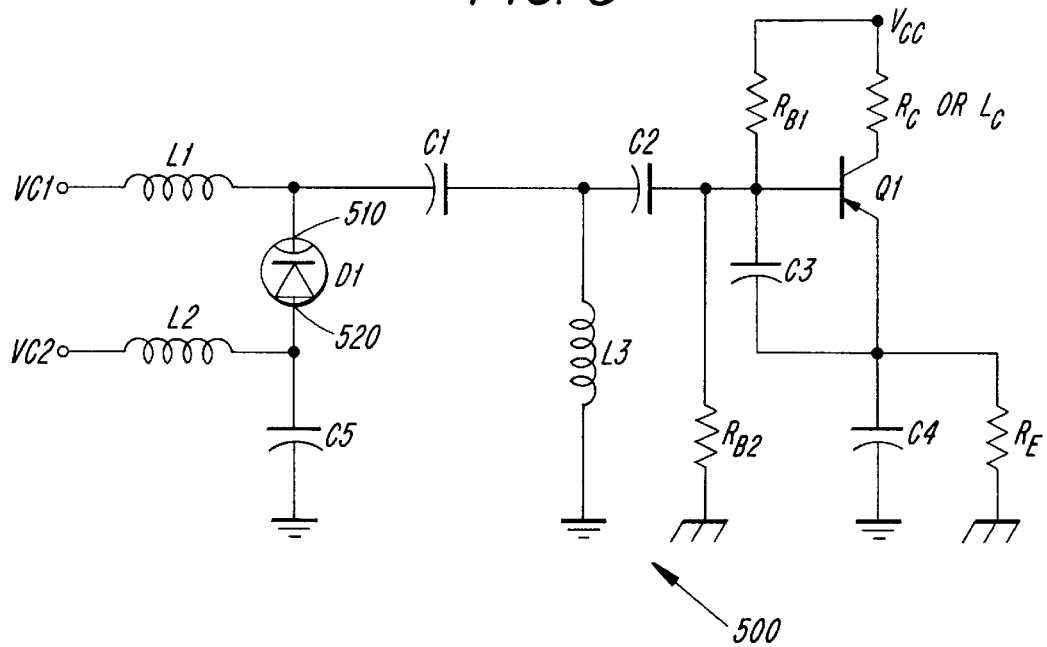
FIG. 5 is a schematic diagram of a voltage controlled oscillator according to the present invention.

In order to provide an increased DC voltage range for use in controlling the operation of a VCO in a PLL circuit, the present invention provides a VCO having a positive DC control input and a negative DC control input. An embodiment of a VCO according to the present invention is illustrated in FIG. 5. As shown in FIG. 5, VCO 500 includes a positive DC control voltage input VC1 and a negative DC control voltage input VC2. VC1 is coupled to the cathode 510 of varactor diode D1 through RF choke inductor L1, causing diode D1 to be reverse biased. VC2 is coupled to the anode 520 of varactor diode D1 through RF choke inductor L2. A capacitor C5 is coupled between the anode 520 of varactor diode D1 and ground. Capacitor C5 provides an AC ground to the control voltage VC2. The remaining elements of VCO 500 are similar in location and function to the corresponding elements described with reference to FIG. 2.

Since a positive DC voltage is applied to the cathode 510 of varactor diode D1 and a negative DC voltage is applied to the anode 520 of varactor diode D1, a greater range of control voltages may be applied to varactor diode D1 than would be available using only one control voltage, leading to a lower average internal series resistance and consequent improved phase noise performance. This permits a VCO according to the present invention to operate at lower control voltages than previous VCO's with a gain that provides acceptable phase noise characteristics for RF communication applications.

Figure 6:
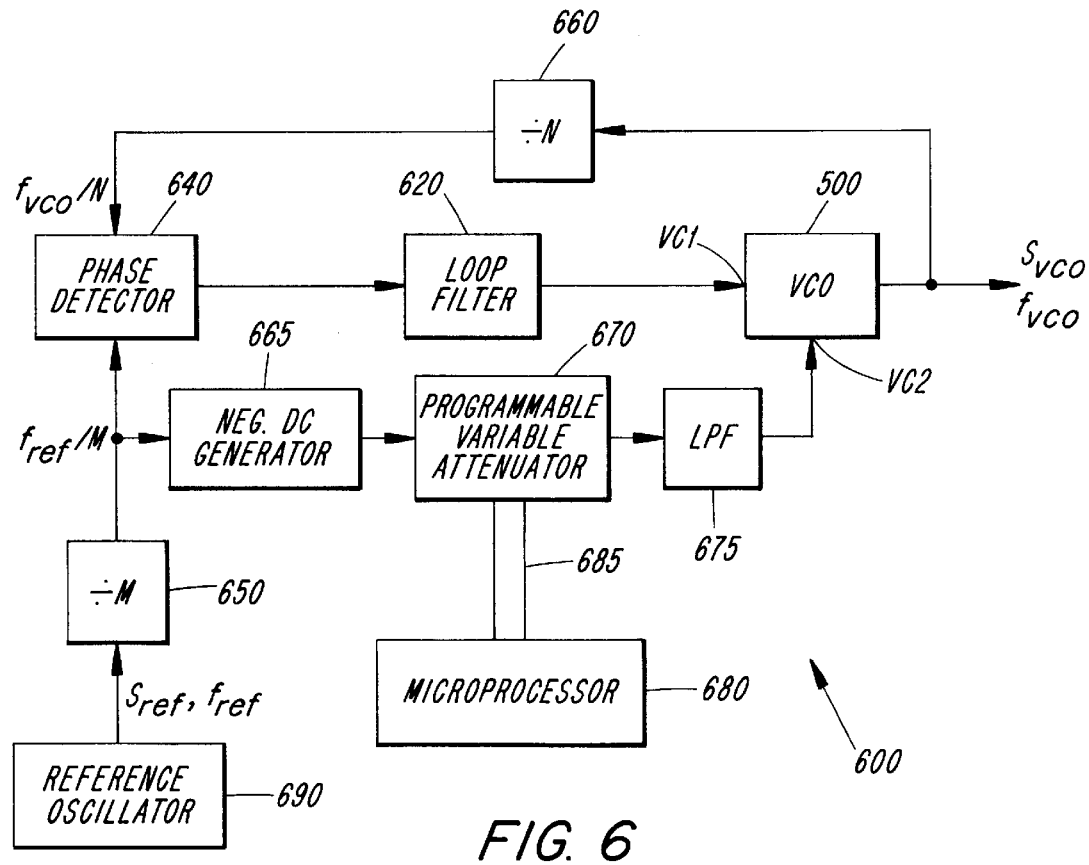
FIG. 6 is a block diagram of a phase locked loop according to the present invention.

An embodiment of a phase-locked loop circuit employing the VCO 500 described above is illustrated in FIG. 6. As shown in FIG. 6, PLL 600 includes a phase detector 640 connected to loop filter 620, which is in turn connected to 500. A VCO divide-by-M circuit is coupled between reference oscillator 690 and phase detector 640. A divide-by-N circuit is coupled between an output of VCO 500 and phase detector 640. VCO 500 is a two-input VCO as illustrated in FIG. 5, having a positive DC input VC1 and a negative DC input VC2. The output of loop filter 320 is coupled to the positive DC input VC1.

In the PLL 600 illustrated in FIG. 6, a negative DC generator 665 is coupled to the output of divide-by-M circuit 650. Negative DC generator 665 generates a negative DC signal from an input sinusoidal signal. The implementation and operation of negative DC generators may be a charge switching device or a conventional recitifier with voltage multiplication, the structure and operation of both of which are well known. Such devices are described for example in J. Ryder, ELECTRONIC FUNDAMENTALS AND APPLICATIONS (5th Ed. 1976) Prentice-Hall, Inc., Ch. 16.

Negative DC generator 665 outputs a negative DC signal to programmable variable attenuator (PVA) 670. PVA 670 selectively attenuates the negative DC signal generated by negative DC generator 665 according to an instruction word supplied by microprocessor 680 via bus 685. The attenuated negative DC signal is then output from PVA 670 to a low pass filter 675, which filters out unwanted AC signal components. Finally, the filtered attenuated negative DC signal is applied as control input VC2 to VCO 500.

By altering the contents of the instruction word supplied to PVA 670, a plurality of negative DC levels may be applied to negative control voltage input VC2. In this manner, the range of control voltage applied to VCO 500 may be extended beyond that which would normally be possible in a low voltage device.

Figure 7:
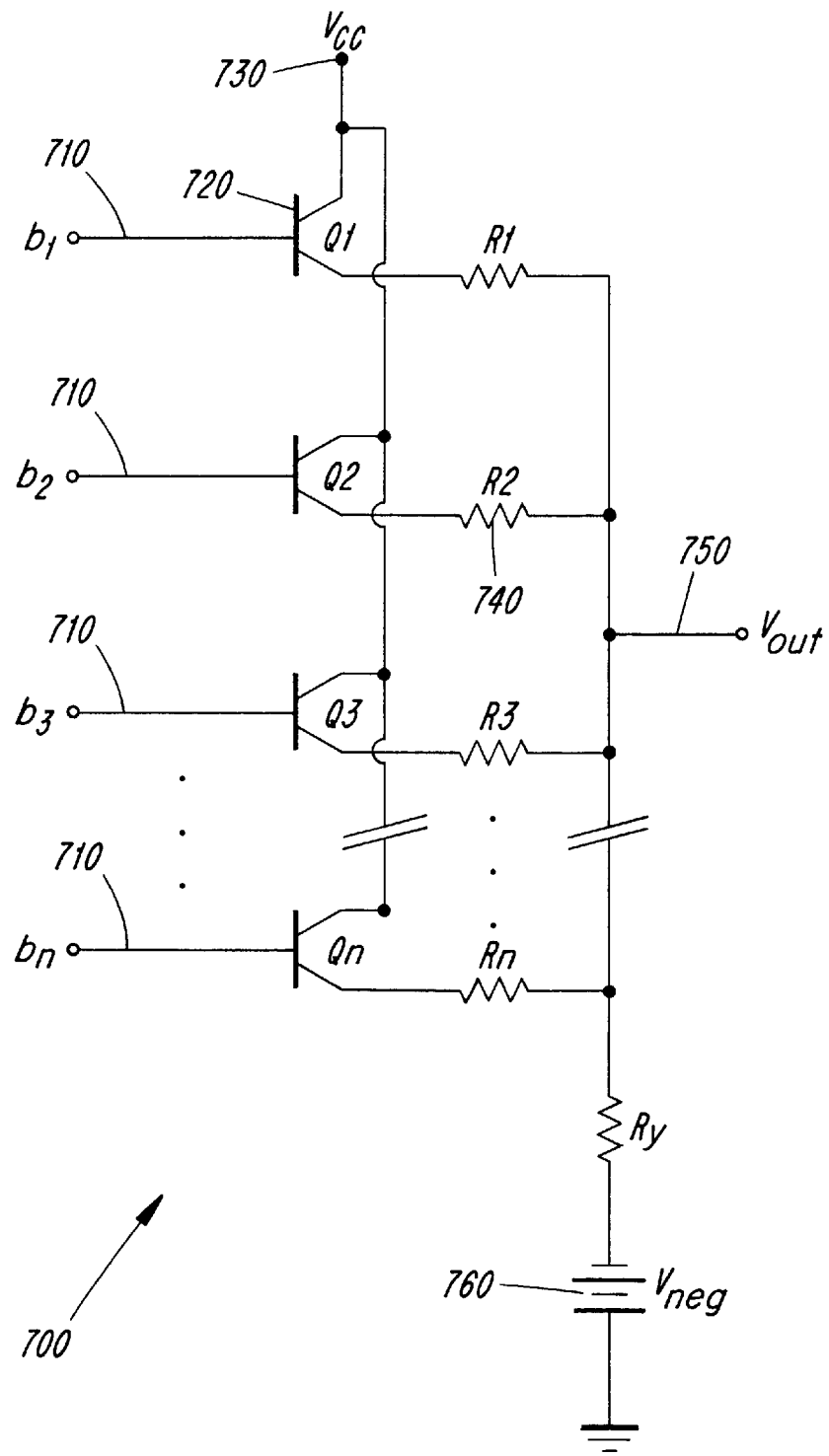
FIG. 7 is a circuit diagram of a programmable variable attenuator according to the present invention.

A circuit diagram of a programmable variable attenuator is illustrated in FIG. 7. PVA 700 includes a plurality of control input lines 710, each of which is coupled to the base of a PNP transistor 720. The emitter of each of the transistors 720 is coupled to a supply terminal 730, and the collector of each transmitter is coupled to a first terminal of one of a plurality of resistors 740. The second terminal of each of the plurality of resistors is coupled to an output terminal 750. A negative DC voltage source 760 is also coupled to the output terminal 750 through resistor Ry. A binary control word is applied as a digital signal to the control inputs 710. The value of the binary control word will determine the level of attenuation of the input negative DC voltage by PVA 700. In the embodiment illustrated in FIG. 7, the programmable variable attenuator has four control inputs. However, more control lines may be easily added as desired for greater flexibility in the selection of attenuation levels.

For example, in a PVA having four input lines, a control word consisting of the binary value 0111 may be applied. In such case, the voltage appearing at b1 will be logical 0 and the voltage appearing at terminals b2–b4 will be logical 1. Thus, only transistor Q1 will be in an "on" state and transistors O2–Q4 will be in an "off" state. Depending on the values of R1 and Ry, the voltage appearing at output terminal 750 will now be an attenuated version of the negative DC voltage level 760. Various control words will result in various combinations of resistances in series with Ry, resulting in various levels of attenuation in the negative DC voltage level.

If the generation of a negative DC voltage signal VC2 is performed using a charge switching device, an unwanted AC ripple may be present in the control signal. However, since the AC signal input to the negative DC generator 665 has a highly stable frequency of oscillation, the unwanted AC components will have a highly predictable and stable frequency. In order to reduce these unwanted components, a low pass filter 675 is used to filter the control signal VC2 prior to applying it to the VCO 610.

The present invention therefore provides a VCO operable using supply voltages lower than have previously been achievable. Since a positive DC voltage is applied to the cathode, and a negative DC voltage is applied to the anode, of a varactor diode, a greater range of control voltages may be applied to the varactor diode than would be available using only one control voltage, leading to a lower average internal series resistance and consequent improved phase noise performance. This permits a VCO according to the present invention to operate at lower supply voltages than previous VCO's with a gain that provides acceptable phase noise characteristics for RF communication applications. The VCO and associated circuitry of the present invention provide a number of additional advantages. For example, a VCO according to the present invention may be manufactured using inexpensive varactor technology and design processes. The design is highly integratable, and would require little if any additional circuit board area to implement. Moreover, the control circuitry can be easily integrated into existing devices.

While the present invention has been described with respect to its preferred embodiment, those skilled in the art will recognize that the present invention is not limited to the specific embodiment described and illustrated herein. Different embodiments and adaptations besides those shown herein and described as well as many variations, modifications and equivalent arrangements will now be apparent or will be reasonably suggested by the foregoing specification and drawings, without departing from the substance or scope of the invention.

What is claimed is:

1. A phase locked loop circuit comprising:
    a voltage controlled oscillator having a first control input for receiving a positive DC voltage, a second control input for receiving a negative DC voltage, and a resonant circuit including a varactor diode having a cathode and an anode, the cathode of said varactor diode coupled to said first control input and the anode of said varactor coupled to said second control input;
    a circuit for selectively supplying different negative DC voltages to said second control input comprising a negative DC voltage generator and a variable attenuator coupled to said negative DC generator; and
    a microprocessor coupled to said variable attenuator,
        wherein said variable attenuator attenuating a DC voltage signal according to the contents of a data word provided by said microprocessor.

2. A phase locked loop circuit according to claim 1, further comprising a low pass filter coupled to the output port of said variable attenuator.

3. A phase locked loop circuit according to claim 1, wherein said negative DC generator is configured to generate a negative DC voltage from an AC voltage signal and said negative DC generator is coupled to a reference oscillator.

4. A phase locked loop circuit, comprising:
    a phase detector;
    a loop filter coupled to said phase detector;
    a voltage controlled oscillator having a first control input terminal for receiving a positive DC voltage, a second control input terminal for receiving a negative DC voltage, a resonant circuit including a varactor having a cathode and an anode, the cathode of said varactor diode coupled to said first control input and the anode of said varactor coupled to said second control input, wherein the first control input terminal of said voltage controlled oscillator is coupled to said loop filter;
    a divide-by-N circuit coupled to said voltage controlled oscillator and to said phase detector;
    a reference oscillator for generating a stable reference signal;
    a divide-by-M circuit coupled to said reference oscillator;
    a negative DC voltage generator;
    a variable attenuator coupled to said negative DC voltage generator and to said voltage controlled oscillator.

5. A phase locked loop circuit according to claim 4, further comprising:
    a low pass filter coupled to said variable attenuator and to the second control input of said voltage controlled oscillator.

6. A phase locked loop circuit according to claim 4, further comprising:
    a microprocessor coupled to said variable attenuator;
        wherein said variable attenuator attenuates a DC voltage signal according to the contents of a data word provided by said microprocessor.

7. A phase locked loop circuit according to claim 4, wherein said negative DC generator is coupled to said divide-by-M circuit.

8. A phase locked loop circuit according to claim 4, wherein said negative DC generator is coupled said reference oscillator.

9. A phase locked loop circuit according to claim 4, wherein said negative DC Generator is coupled to said divide-by-N circuit.

10. A frequency synthesizer comprising:
- a voltage controlled oscillator having a first control input for receiving a positive DC voltage, a second control input for receiving a negative DC voltage, and a resonant circuit including a varactor having a cathode and an anode, the cathode of said varactor diode coupled to said first control input and the anode of said varactor coupled to said second control input;
- a circuit for selectively supplying different negative DC voltages to said second control input comprising a negative DC voltage generator; and a variable attenuator coupled to said negative DC generator; and
- a microprocessor coupled to said variable attenuator, wherein said variable attenuator attenuating a DC voltage signal according to the contents of a data word provided by said microprocessor.

11. A frequency synthesizer according to claim 10, further comprising:
- a low pass filter coupled to said variable attenuator.

12. A frequency synthesizer according to claim 10, wherein said negative DC generator generates a negative DC voltage from an AC voltage signal and said negative DC generator is coupled to a reference oscillator.

13. A phase locked loop circuit comprising:
- a reference oscillator for generating a stable reference signal;
- a divided-by-M circuit coupled to said reference oscillator;
- a circuit for selectively supply different negative DC voltages comprises a negative DC voltage generator coupled to said divide-by-M circuit and a variable attenuator coupled to said negative DC generator; and
- a voltage controlled oscillator having a first control input for receiving a positive DC voltage, a second control input for receiving a negative DC voltage from said circuit, and a resonant circuit including a varactor diode having a cathode and an anode, the cathode of said varactor diode coupled to said first control input and the anode of said varactor coupled to said second control input.

* * * * *